United States Patent
Toro-Lira

[11] Patent Number: 6,075,245
[45] Date of Patent: Jun. 13, 2000

[54] HIGH SPEED ELECTRON BEAM BASED SYSTEM FOR TESTING LARGE AREA FLAT PANEL DISPLAYS

[76] Inventor: Guillermo L. Toro-Lira, 1180 Reed Ave., Apt. No. 58, Sunnyvale, Calif. 94086

[21] Appl. No.: 09/005,979

[22] Filed: Jan. 12, 1998

[51] Int. Cl.[7] .................................................. H01J 37/00
[52] U.S. Cl. ............................................................ 250/310
[58] Field of Search ...................................... 250/310, 397

[56] References Cited

U.S. PATENT DOCUMENTS

| | | | |
|---|---|---|---|
| 3,961,190 | 6/1976 | Lukianoff et al. | 250/310 |
| 4,996,590 | 2/1991 | Okamoto et al. | 348/645 |
| 5,834,900 | 11/1998 | Tanaka et al. | 315/169.1 |

OTHER PUBLICATIONS

Yakowitz, H., (1972) "The Cylindrical Secondary Electron Detector as a Voltage Measuring Device in the Scanning Electron Microscope," Scanning Electron Microscopy/1972 (Part 1) Proceedings of the Fifth Annual Scanning electron Microscope Symposium, ITT Research Institute, Chicago, IL, pp. 33–40.

*Primary Examiner*—Kiet T. Nguyen
*Attorney, Agent, or Firm*—Burns Doane Swecker & Mathis L.L.P.

[57] ABSTRACT

A CRT gun is used to inspect substrates in a voltage contrast system. The CRT gun directs a beam of electrons at the substrate, which is at least partially disposed in a vacuum chamber. The vacuum chamber is evacuated and provided with an electron detector to sense secondary electron emission due to impingement of the electron stream on the substrate. In an alternative embodiment, a plurality of CRT guns are used in conjunction with a common vacuum chamber. The plural CRTs may share a common electron detector, or may each be provided with an associated electrostatically isolated detector. The system is preferably used to detect flat panel displays (FPDs) during manufacture.

19 Claims, 5 Drawing Sheets

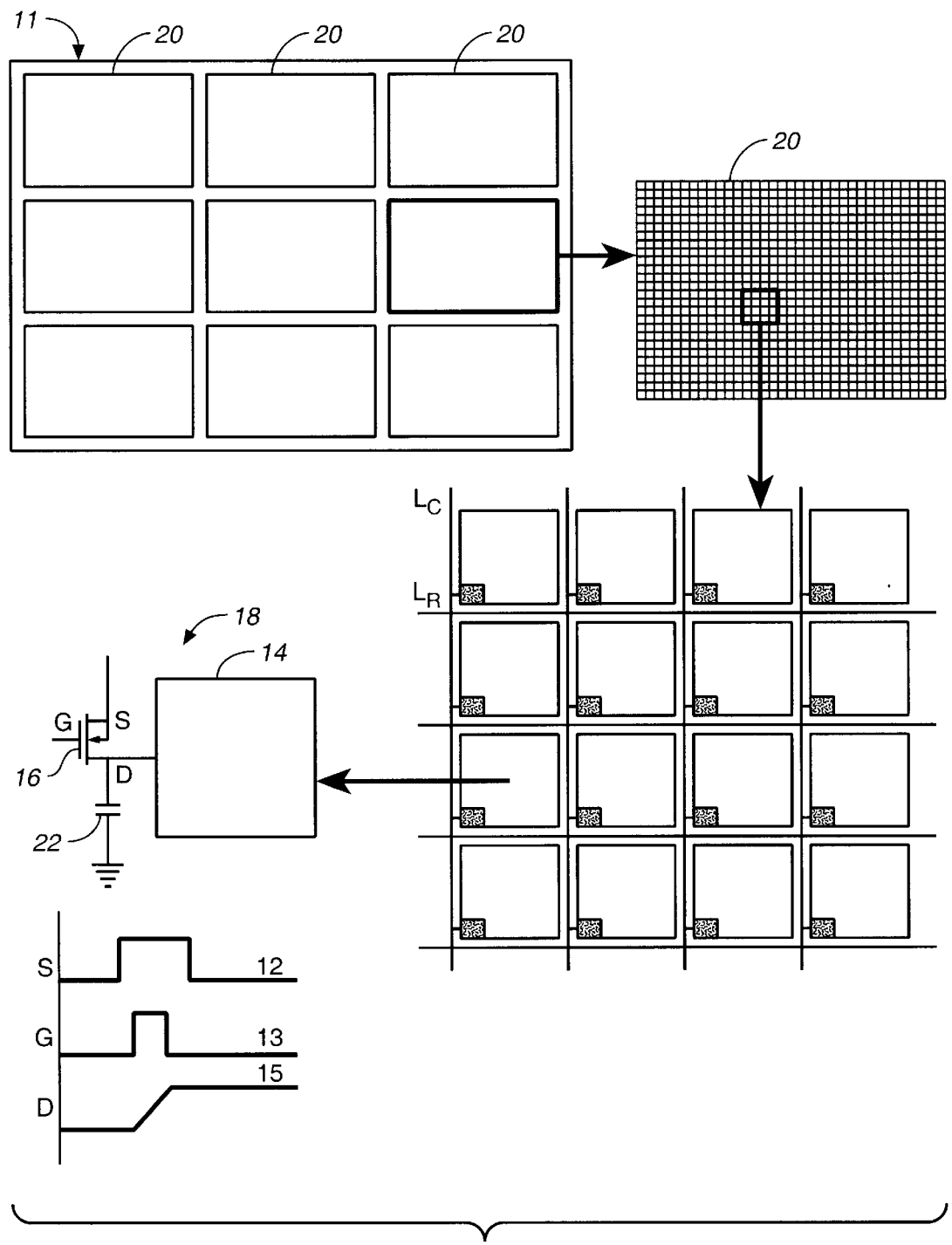
FIG._1
(PRIOR ART)

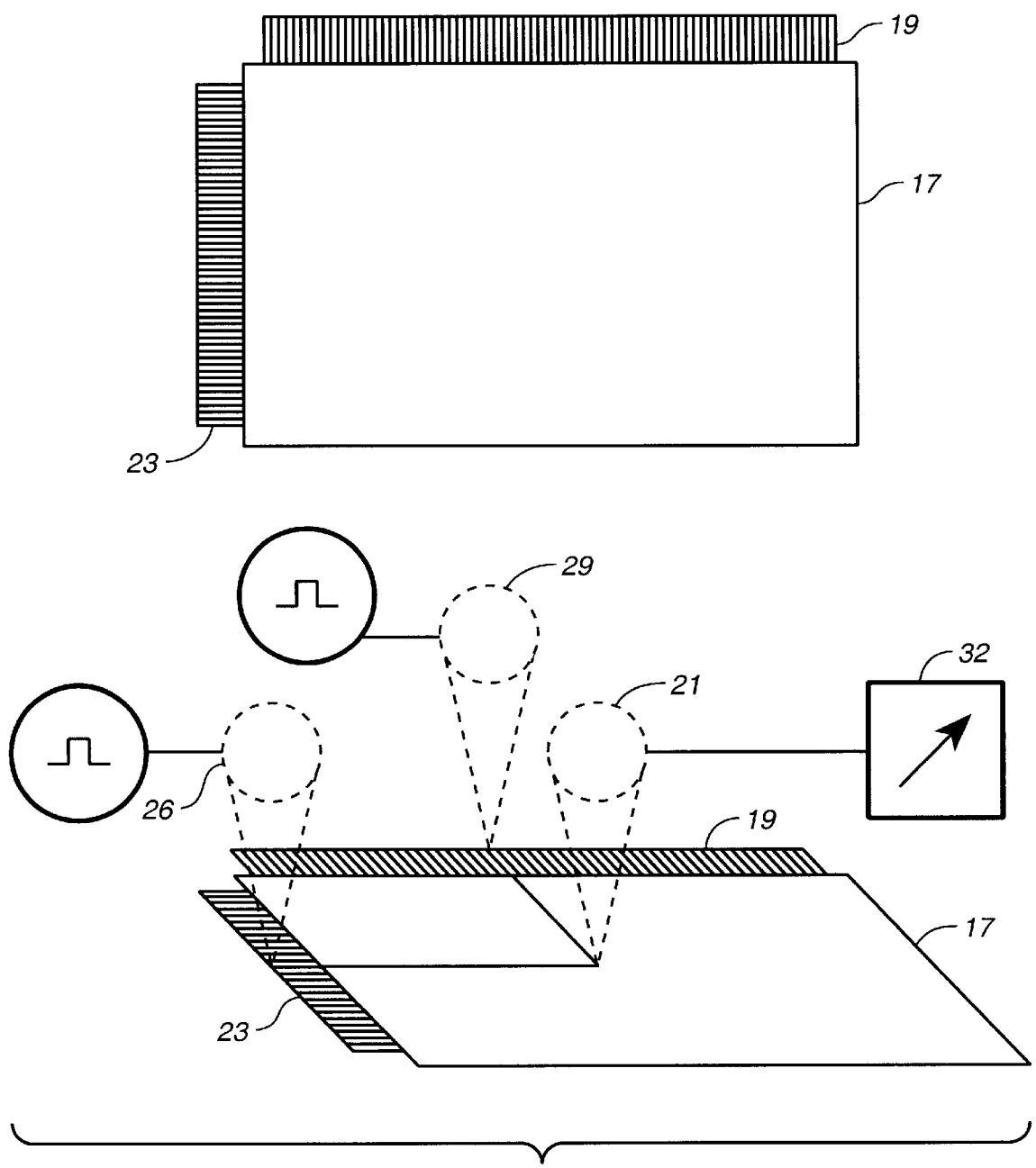
FIG._2
*(PRIOR ART)*

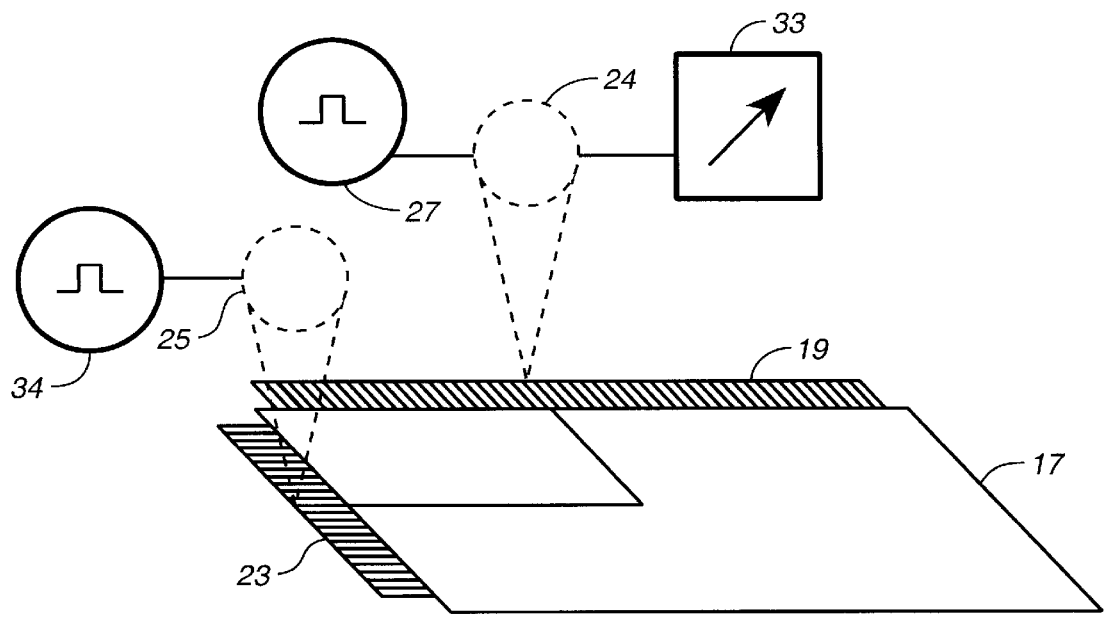
FIG._3 (PRIOR ART)
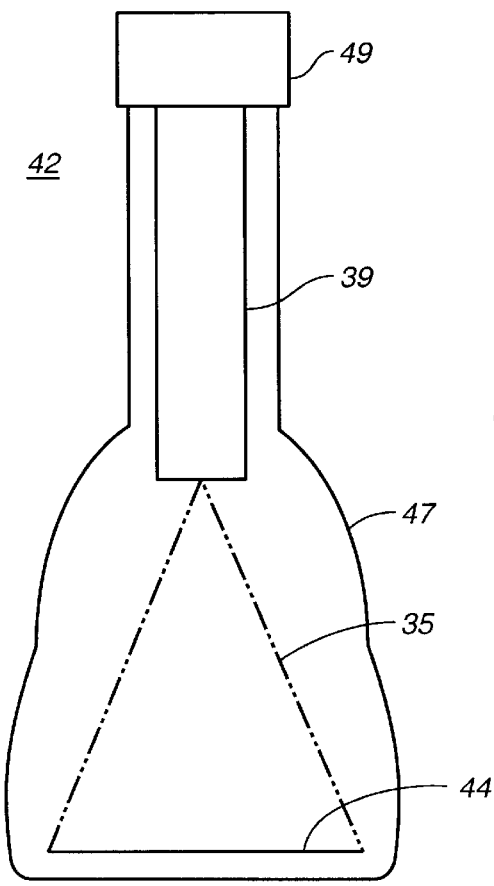
FIG._5
(PRIOR ART)

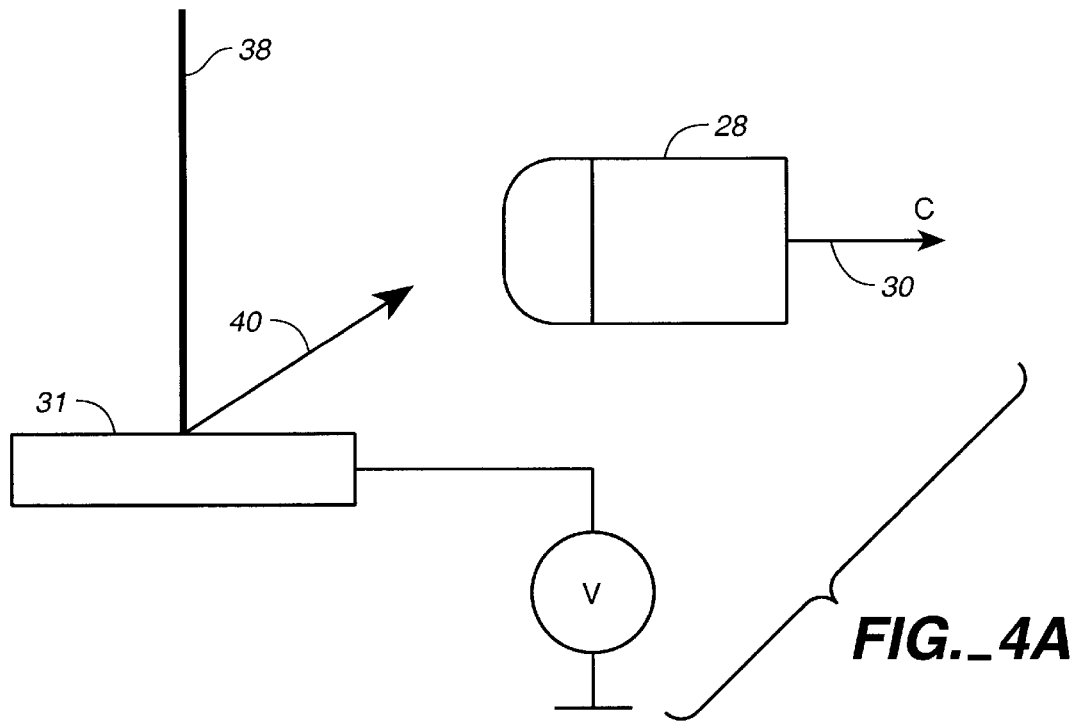
FIG._4A
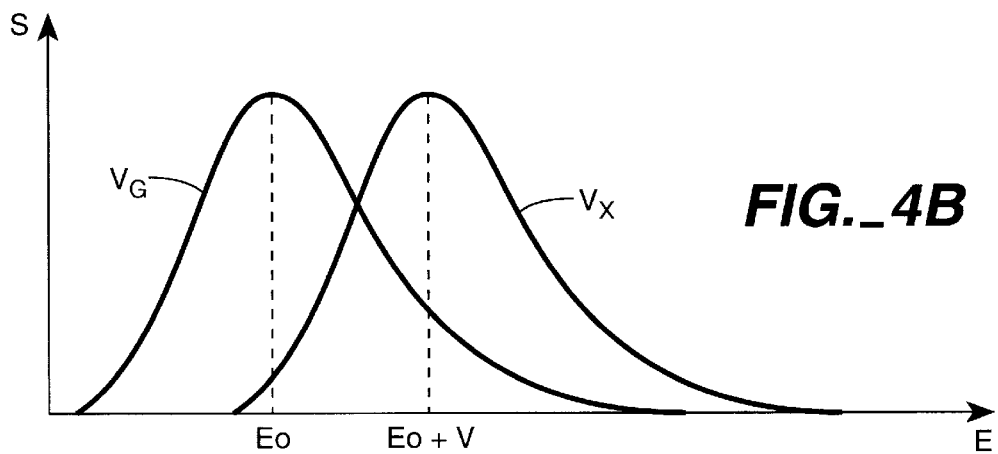
FIG._4B
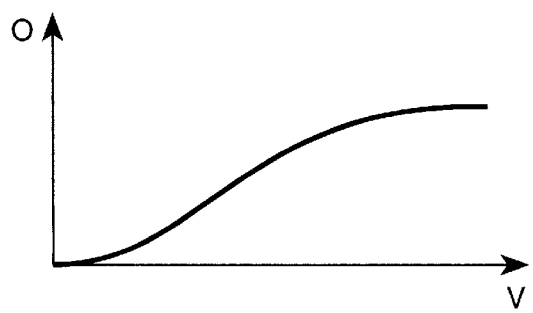
FIG._4C
(PRIOR ART)

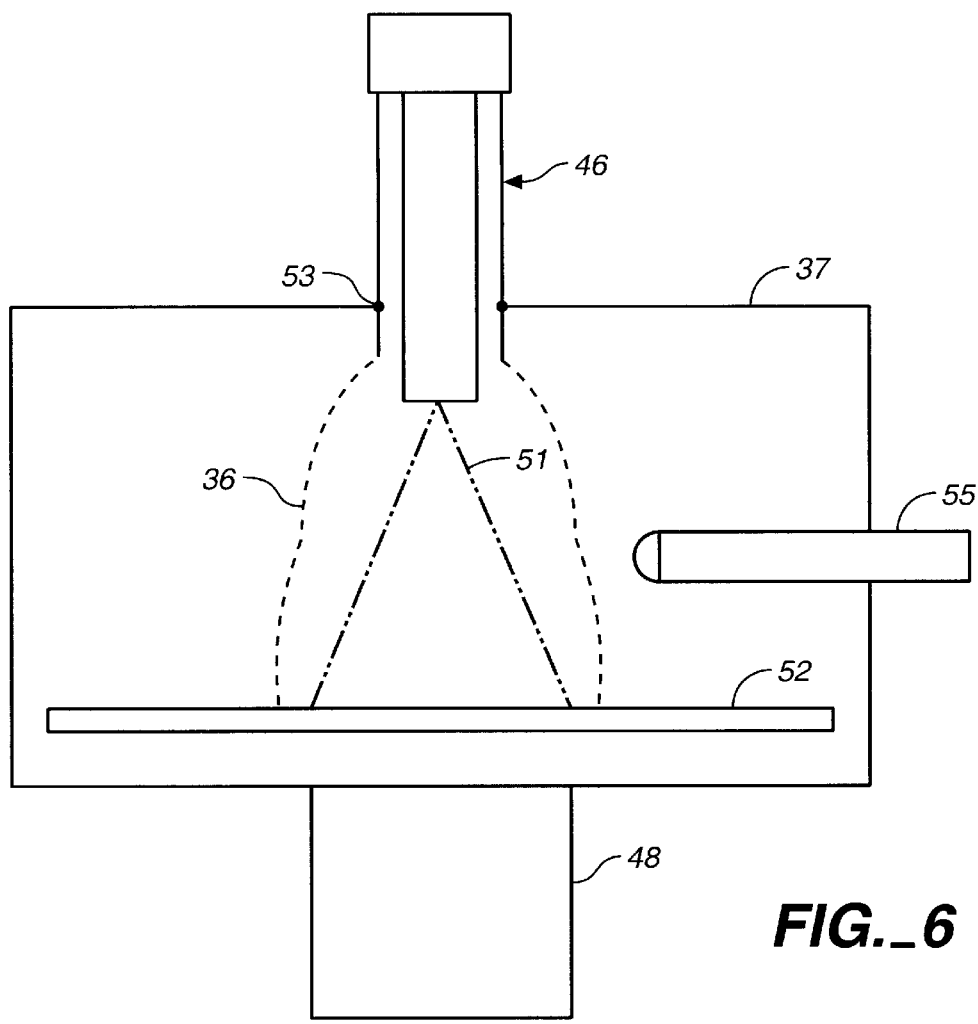
FIG._6
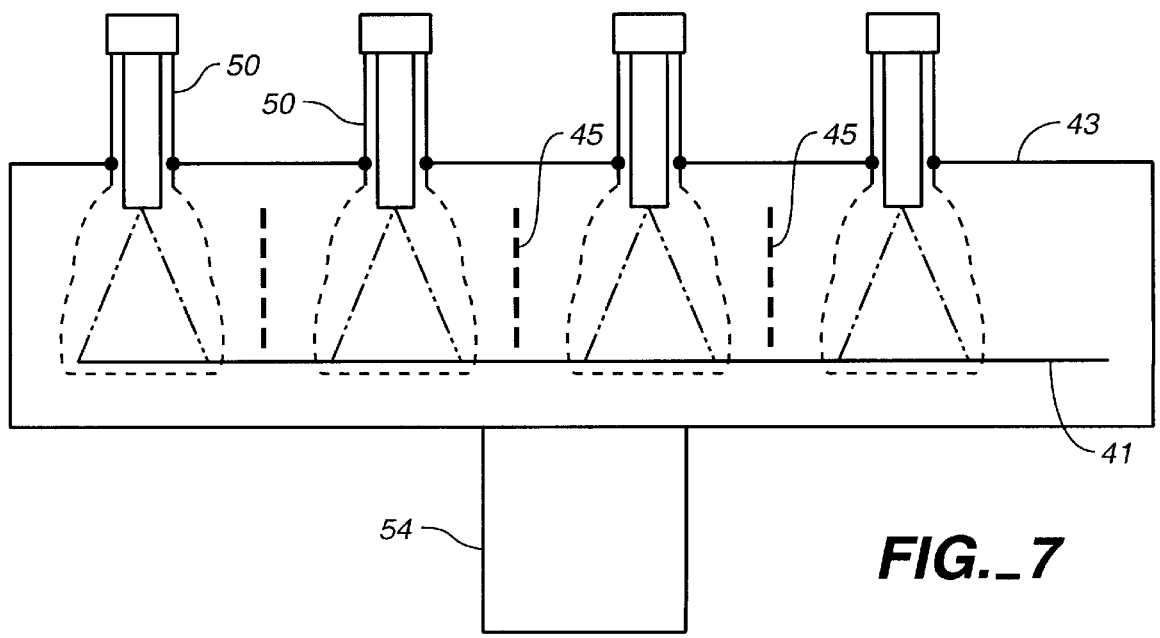
FIG._7

HIGH SPEED ELECTRON BEAM BASED SYSTEM FOR TESTING LARGE AREA FLAT PANEL DISPLAYS

BACKGROUND OF THE INVENTION

1. Field of the Invention

This invention relates to testing systems, and more particularly, to the high speed testing of substrates using an electron beam.

2. Description of Related Art

Flat panel displays (FPDs) are viable alternatives to Cathode Ray Tubes (CRTs) for display of electronic information. They provide several advantages related to their small size and low power consumption. However, some manufacturing problems, such as the capability to test their expected performance during manufacturing, make them more expensive than typical CRTs. It is known that for replacing the CRT in consumer applications, such as TVs, the manufacturing costs of the FPDs must drop significantly. Currently the most popular FPD technology is the Thin Film Transistor (TFT) Liquid Crystal Display (LCD). It is used in high end laptop computers, where the price sensitivity is not as significant as in general consumer electronics.

FIG. 1 schematically illustrates a typical TFT FPD layout. A multiplicity of TFT FPDs 20 are manufactured in a single glass substrate 11 using lithographic and semiconductor processes similar to those used in the manufacture of integrated circuits. A typical FPD 20 consists of an array of pixel electrodes that are individually and repetitively activated to control the liquid crystal light emission of the panel and therefore generate a two dimensional picture. The pixels are arranged in a column and row matrix layout. During display operation, each pixel is addressed by selecting the appropriate row $L_R$ and column $L_C$ signals. Each pixel 18 contains a pixel electrode 14, a TFT 16 and a storage capacitor 22. The TFT 16 is configured as an electronic switch. The TFT gate or switch control electrode G is connected to the display row selection signal $L_R$ and the TFT source electrode S to the display column signal $L_C$. At the time of individual pixel activation, the required voltage signal for the pixel is presented at the column line 12 and the TFT is switched on for a short time by activating the row signal 13. During that time, the storage capacitor 22 will charge to the voltage value presented on the TFT source line 15 and will maintain the voltage value until the next pixel refreshing cycle. By repeating this process to all the pixels in the display, a two dimensional image can be represented in the display.

Currently, the dominant technology for testing TFT FPD substrates is based on direct electrical measurements provided by mechanical contact probes. FIG. 2 shows one such method. The column and row activation signals of the FPD are typically taken to two edges of the panel 17. In most cases, for Electrostatic Discharge (ESD) protection reasons, the column 19 and row 23 lines are connected together with a resistive network which is later removed during the final steps of manufacture. In any case, a mechanical probe 21 is placed in contact with the particular pixel under test (PUT). The corresponding pixel row and column lines are also contacted with mechanical probes 26 and 29. These two probes generate the TFT pixel activation signals. The pixel signal is directly measured and its proper operation assessed using a multimeter type tester 32.

There are other types of mechanical contact probing techniques that do not use probe 21 but instead measure current signals generated in the row and column lines to give an indirect indication of the pixel condition. Such a system is shown in FIG. 3. In this case, the row or TFT gate signal line is contacted using probe 25 and a signal is injected using signal generator 34, while the TFT source signal line is contacted with probe 24 and a signal injected with generator 27 and currents read with multimeter type detector 33. This arrangement provides an indirect test of the condition of the PUT and does not need a mechanical contact probe directly into the PUT.

All mechanical contact probing methods have the major disadvantage that they require a large amount of mechanical contacts (one mechanical probe per row and column lines), signal generators and signal detectors. These mechanical probes are very expensive and must be completely replaced periodically. The probe replacement costs are around $100,000.

Optical test methods are also known. In this type of system all the rows and columns are activated simultaneously—by using the ESD shorting bars—and the voltage values of the pixels are recorded using a piezostrictive optical modulator that is scanned in very close proximity to the panel. This method eliminates the need for a large number of probes, but is slow and not well suited for mass production.

A well known prior art for non-contact voltage measurements is the voltage contrast phenomenon produced by an electron beam. This principle can be briefly explained with the aid of FIGS. 4A, 4B and 4C. As shown in FIG. 4A, when an electron beam 38 impinges a conductive sample 31, secondary electrons 40 are emitted from the surface. These electrons are electrostatic and are directed to a secondary electron detector 28 which converts the electron count to an electrical signal 30. If the sample 31 is connected to ground potential, the secondary electrons have an energy distribution as shown in graph $V_G$ of FIG. 4B. If the sample is electrically biased to any voltage V as FIG. 4A depicts, the energy distribution curve of the secondary electrons is proportionally shifted by the same amount V as shown in graph $V_X$ of FIG. 4B. If the secondary electron detector response is a function of the energies of the received secondary electrons, then the shift in the energy distribution will also cause a variation in the signal output 30. By measuring such a variation, the voltage V present at the sample can be inferred and the state of the sample under inspection deduced. Typically, the transfer function of a detection system of this kind is non-linear as shown in FIG. 4C, where V is the voltage at the sample and O is the signal of the detector. With a special type of detector, such as an electron spectrometer, the transfer function can be linearized to allow for a direct measurement of the voltage at the sample.

Several Publications and patents have been issued in this relatively well known prior art. Reference is made, for example, to U.S. Pat. No. 3,961,190, directed to a "Voltage Contrast Detector for a Scanning Electron Beam Instrument", by Lukianoff et al., 1976 and the paper "The Cylindrical Secondary Electron Detector as a Voltage Measuring Device in the Scanning Electron Microscope" by Ballantyne et al., Scanning Electron Microscopy/1972 (Part I).

In principle, the electron beam voltage contrast technique could be used for the inspection of the electrical signal on FPDs electrode substrates. However, speed limitations related to the small scanning area of the electron beam and the requirement of high vacuum conditions makes this technique unsuited for FPD mass production, where inspection speed is of paramount importance.

Electron beam voltage contrast, or E-Beam testing, has been successfully used in Integrated Circuit (IC) applications. In these applications a very small electron beam spot is used to create an image and to measure the voltages present in ICs in areas smaller that one micrometer. However, its use is impractical for the high speed inspection requirements during the manufacturing of FPDs. This is because of several technological limitations, one being the maximum obtainable electron beam scan area which at the very best is only a few millimeters. The near future FPDs substrates have areas approaching 1000×1000 millimeters. Another limitation is that the electron beam needs of a high vacuum environment impose prohibitive inspection time overhead.

SUMMARY OF THE INVENTION

The invention overcomes the deficiencies of the prior art by making use of modified Cathode Ray Tube (CRT) displays to provide large electron beam scan areas for the high speed testing of large area FPDs. In accordance with the invention, the FPD under inspection is disposed in a high vacuum chamber into which an electron beam from the tube part of a CRT, referred to hereinafter as the CRT gun, is directed. The generated electron beam is scanned across the FPD surface in the chamber. The electrons emanating from the surface are detected by an electron detector to thereby effect voltage contrast, or E-beam testing of the FPD.

In a second embodiment, a multiplicity of CRT guns is used, with the CRT guns sharing a common vacuum chamber in which the FPD surbstrate is disposed for inspection. The CRT guns can each be provided with a corresponding electron detector, in which electrostatic shields may be used to separate detection regions. Alternatively, the CRT guns may all share a common electron detector. In such a multiple gun arrangement, CRT scanning areas may overlap, or, in an alternative aspect of the embodiment, gaps may be provided between scanning areas such that inspection of the FPD may need to be performed over the course of multiple scans.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIG. 1 is a schematic illustration of a conventional FPD during the manufacturing process;

FIG. 2 is a schematic illustration of a conventional FPD testing system using mechanical contact probe and based on direct electrical measurements;

FIG. 3 is a schematic illustration a second type of conventional FPD testing system using mechanical probes and based on current signals;

FIG. 4 is a schematic illustration showing conventional voltage contrast, or E-beam testing techniques;

FIG. 5 is a schematic illustration of a conventional CRT device;

FIG. 6 is a schematic illustration of a testing device in accordance with a first embodiment of the invention; and FIG. 7 is a schematic illustration of a testing device in accordance with a second embodiment of the invention.

DESCRIPTION OF THE PREFERRED EMBODIMENTS

A typical CRT 42 is shown in FIG. 5. The basic CRT display tube is a glass enclosure 47 under a high vacuum in the order of 10e–5 to 10e–8 Torr. A high energy electron beam 35 is electronically scanned and impinges an internal light emitting phosphorous coating 44. The electron beam is controlled with electrostatic and/or electromagnetic lenses and deflection devices 39. The electron beam is typically of the thermo-ionic emission type and is generated in region 49. For purposes of this discussion, the conventional device 42 will be referred to as a CRT display, whereas the components exclusive of the glass enclosure 47 and the phosphorous coating 44 will be referred to as the CRT gun.

As shown in FIG. 6, an arrangement in accordance with the invention uses a CRT display essentially cut open and installed into a high vacuum chamber containing the FPD under test. The CRT gun 46 is coupled with a high vacuum chamber 37 using a vacuum seal 53, the vacuum chamber 37 effectively replacing the glass enclosure 36 of the conventional CRT display. The chamber 37 is brought to the CRT gun operational pressure using a high vacuum pump arrangement 48. The electron beam 51 generated by the CRT gun 46 is then scanned across the FPD under test (52) in a work region and the electrons emanating from the sample are detected using an electron detector 55. The electron detector can be of the Everhart-Thornley type for the collection of secondary electrons which are the ones that carry the voltage contrast information.

FIG. 7 shows an arrangement in accordance with a second embodiment of the invention. In some cases, it may be desirable to increase the effective scan area by using a set of multiple modified CRT displays, each associated with a corresponding work sub-region. This arrangement is feasible due to the inexpensive cost of CRTs as compared to the sophisticated electron beam guns used in current electron beam testers and Scanning Electron Microscopes (SEMs). Also, the CRTs' geometry allows for close geometrical integration in a multiple electron beam arrangement. As seen in FIG. 7, a plurality of CRT guns 50 are arranged in line. These guns share a common vacuum chamber 43 which is evacuated by pump 54. Although not shown for purposes of clarity, the arrangement may have only one secondary electron detector for all the CRT guns 50, or alternatively, one detector per CRT gun. The decision is based on the required speed of operation—in which the multiple detector arrangement provides much faster inspection operation due to the parallel processing architecture. FIG. 7 shows 4 CRT guns, but there can be as many as required to cover any specific FPD area. Also, the CRT guns 50 can be positioned with a space between them, as shown in the drawing figure, or they can be disposed adjacent to each other with overlapping scan areas. The selection of the spacing will depend on the cost performance ratio required and on the configuration of the specific secondary electron detectors, which are not shown in the drawing for simplicity. In the case of the spacing arrangement shown in the drawing, total substrate coverage could be achieved by incrementally scanning the FPD 41 twice under the set of CRT guns 50 each with a horizontal offset equal to half the distance between guns. Of course, other scanning schemes fall within the purview of the invention.

In the case of having one electron detector per CRT gun, care must be taken to prevent the secondary electrons generated from the guns 50 from interacting into more than one detector. Depending on the distance of each detector to each gun scan area, the guns may be electrostatically shielded in the regions shown with dash lines 45 in FIG. 7. The purpose of the electrostatical shielding is to allow only the electrons emanating from each gun to be collected by its corresponding electron detector.

The above are exemplary modes of carrying out the invention and are not intended to be limiting. It will be apparent to those skilled in the art that modifications thereto can be made without departure from the spirit and scope of the invention as set forth in the following claims.

What is claimed is:

1. A CRT device for testing a substrate using voltage contrast, the device comprising:
    at least one CRT gun for directing a stream of electrons at the substrate;
    a vacuum chamber defining a substantially enclosed work region and adapted to contain at least a portion of the substrate under vacuum conditions in the work region, the stream of electrons impinging the substrate in the work region; and
    an electron detector for sensing secondary electrons emanating from the substrate.

2. The device of claim 1, wherein the electron detector is disposed in the vacuum chamber.

3. The device of claim 1, wherein the CRT gun is at least partially disposed in the vacuum chamber, and wherein a vacuum seat is provided to couple the CRT and the vacuum chamber to thereby substantially maintain vacuum conditions in the vacuum chamber.

4. The device of claim 1, wherein a vacuum pump is provided to develop vacuum conditions in the vacuum chamber.

5. The device of claim 1, wherein the substrate comprises a flat panel display.

6. The device of claim 1, wherein a plurality of CRT guns are used, each CRT gun providing an associated electron stream in an associated sub-region of the work region.

7. The device of claim 6, wherein each sub-region is provided with an associated electron detector.

8. The device of claim 7, wherein electrostatic shielding is used to confine electron detection by each detector to electrons emanating from an associated sub-region.

9. The device of claim 8, wherein the sub-regions overlap.

10. The device of claim 8, wherein the sub-regions are separated by spaces, the substrate being incrementally scanned to effect voltage contrast detection over its entirety.

11. A voltage contrast method for testing a substrate using a CRT gun, the method comprising:
    enclosing a work region in vacuum conditions;
    disposing at least a portion of the substrate in the work region;
    directing at least one stream of electrons from a CRT gun at the substrate in the work region; and
    detecting secondary electrons emanating from the substrate.

12. The method of claim 11, wherein the step of enclosing comprises providing a vacuum chamber defining the work region, the CRT gun being coupled to the vacuum chamber using a vacuum seal.

13. The method of claim 11, wherein the vacuum conditions are developed using a vacuum pump in communication with the work region.

14. The method of claim 11, wherein the substrate comprises a flat panel display.

15. The method of claim 11, wherein the step of directing comprises using a plurality of CRT guns each providing an associated electron stream in an associated sub-region of the work region.

16. The method of claim 15, wherein each sub-region is provided with an associated electron detector.

17. The method of claim 16, wherein electrostatic shielding is used to confine electron detection by each detector to electrons emanating from an associated sub-region.

18. The method of claim 17, wherein the sub-regions overlap.

19. The method of claim 17, wherein the sub-regions are separated by spaces, the substrate being incrementally scanned to effect voltage contrast detection over its entirety.

* * * * *